(12) United States Patent
Sidi et al.

(10) Patent No.: US 8,793,560 B2
(45) Date of Patent: Jul. 29, 2014

(54) LOG-LIKELIHOOD RATIO (LLR) COMPUTATION USING PIECEWISE LINEAR APPROXIMATION OF LLR FUNCTIONS

(75) Inventors: Jonathan Sidi, San Francisco, CA (US); Rajesh Sundaresan, Bangalore (IN)

(73) Assignee: Qualcomm Incorporated, San Diego, CA (US)

( * ) Notice: Subject to any disclaimer, the term of this patent is extended or adjusted under 35 U.S.C. 154(b) by 1230 days.

(21) Appl. No.: 11/685,639

(22) Filed: Mar. 13, 2007

(65) Prior Publication Data

US 2007/0260959 A1   Nov. 8, 2007

Related U.S. Application Data

(60) Provisional application No. 60/782,378, filed on Mar. 14, 2006.

(51) Int. Cl.
*H03M 13/03* (2006.01)
*H03M 13/00* (2006.01)

(52) U.S. Cl.
USPC ............................. 714/794; 714/795; 714/780

(58) Field of Classification Search
USPC ......................................... 714/794, 795, 780
See application file for complete search history.

(56) References Cited

U.S. PATENT DOCUMENTS

| | | | | |
|---|---|---|---|---|
| 4,847,797 A | * | 7/1989 | Picchi et al. | 708/3 |
| 5,933,462 A | * | 8/1999 | Viterbi et al. | 375/341 |
| 6,078,626 A | * | 6/2000 | Ramesh | 375/262 |
| 6,317,456 B1 | * | 11/2001 | Sayeed | 375/227 |
| 6,594,318 B1 | * | 7/2003 | Sindhushayana | 375/262 |
| 6,625,236 B1 | * | 9/2003 | Dent et al. | 375/341 |
| 6,819,630 B1 | * | 11/2004 | Blackmon et al. | 367/134 |
| 6,834,088 B2 | * | 12/2004 | Agami et al. | 375/324 |
| 7,003,709 B2 | * | 2/2006 | Wengerter et al. | 714/748 |

(Continued)

FOREIGN PATENT DOCUMENTS

| | | |
|---|---|---|
| JP | 2004032125 A | 1/2004 |
| JP | 2008519519 A | 6/2008 |
| WO | WO0167617 | 9/2001 |
| WO | WO2006048597 | 5/2006 |

OTHER PUBLICATIONS

Jae Kyun Kwon; Suwon Park; Dan Keun Sung; "Log-likelihood ratio (LLR) conversion schemes in orthogonal code hopping multiplexing," IEEE Communications Letters, vol. 7, No. 3, pp. 104-106, Mar. 2003.*

(Continued)

*Primary Examiner* — Joseph D Torres
(74) *Attorney, Agent, or Firm* — S. Hossain Beladi

(57) ABSTRACT

Techniques for efficiently and accurately computing log-likelihood ratio (LLRs) for code bits are described. A set of code bits may be mapped to a modulation symbol in a signal constellation. Different code bits in the set may be associated with different LLR functions. A receiver obtains received symbols for a transmission sent via a communication channel. The receiver derives LLRs for code bits based on the received symbols and piecewise linear approximation of at least one LLR function. The piecewise linear approximation of each LLR function may comprise one or more linear functions for one or more ranges of input values. The receiver may select one of the linear functions for each code bit based on a corresponding received symbol component value. The receiver may then derive an LLR for each code bit based on the linear function selected for that first code bit.

31 Claims, 8 Drawing Sheets

(56) References Cited

U.S. PATENT DOCUMENTS

| | | | |
|---|---|---|---|
| 7,076,000 B2 * | 7/2006 | Rodriguez | 375/262 |
| 7,173,974 B2 * | 2/2007 | Sindhushayana | 375/262 |
| 7,184,486 B1 * | 2/2007 | Wu et al. | 375/262 |
| 7,453,960 B1 * | 11/2008 | Wu et al. | 375/340 |
| 7,555,067 B2 * | 6/2009 | Jeong | 375/340 |
| 7,583,744 B2 * | 9/2009 | Sindhushayana | 375/262 |
| 2004/0179583 A1 * | 9/2004 | Jeong | 375/147 |

OTHER PUBLICATIONS

Hyun K et al: "Bit metric generation for Gray coded QAM signals Capacity approaching codes design and implementation" IEE Proceedings : Communications, Institution of Electrical Engineers, GB, vol. 152, No. 6, Dec. 9, 2005, pp. 1134-1138, XP006025741 ISSN: 1350-2425.

International Search Report and Written Opinion—PCT/US2007/064014, International Search Authority—European Patent Office—Mar. 26, 2009.

Le Goff S et al: "Turbo-codes and high spectral efficiency modulation" Communications, 1994. ICC "94, Supercomm/ICC "94, Conference Record, "Serving Humanity Through Communications." IEEE International Conference on New Orleans, LA, USA Nay 1-5, 1994, New York, NY, USA.IEEE, May 1, 1994, pp. 645-649, XP010126658 ISBN: 978-0-7803-1825-0.

Noorbakhsh M et al: "Combined turbo equalisation and block turbo coded modulation" IEE Proceedings : Communications, Institution of Electrical Engineers, GB, vol. 150, No. 3, May 13, 2003, pp. 149-152, XP006020423 ISSN: 1350-2425

Seguin F et al: "Analogue 16-QAM demodulator" Electronics Letters, IEE Stevenage, GB, vol. 40, No. 18, Sep. 2, 2004, pp. 1138-1140, XP006022554 ISSN: 0013-5194.

Filippo et al., "Simplified Soft-Output Demapper for Binary Interleaved COFDM with Application to HIPERLAN/2", Internet <http://www.hpl.hp.com/techreports/2001/HPL-2001-246.pdf>, Oct. 10,2001.

Taiwan Search Report—TW096108798—TIPO—May 10, 2011.

* cited by examiner

LOG-LIKELIHOOD RATIO (LLR) COMPUTATION USING PIECEWISE LINEAR APPROXIMATION OF LLR FUNCTIONS

The present application claims priority to provisional U.S. Application Ser. No. 60/782,378, entitled "ESTIMATION FOR SIGNAL CONSTELLATION AND NOISE VARIANCE FOR 16QAM," filed Mar. 14, 2006, assigned to the assignee hereof and incorporated herein by reference.

BACKGROUND

I. Field

The present disclosure relates generally to communication, and more specifically to techniques for computing log-likelihood ratio (LLRs) for code bits.

II. Background

In a communication system, a transmitter typically encodes traffic data based on a coding scheme to obtain code bits and further maps the code bits to modulation symbols based on a modulation scheme. The transmitter then processes the modulation symbols to generate a modulated signal and transmits this signal via a communication channel. The communication channel distorts the transmitted signal with a channel response and further degrades the signal with noise and interference.

A receiver receives the transmitted signal and processes the received signal to obtain received symbols, which may be distorted and noisy versions of the modulation symbols sent by the transmitter. The receiver may then compute LLRs for the code bits based on the received symbols. The LLRs are indicative of the confidence in zero ('0') or one ('1') being sent for each code bit. For a given code bit, a positive LLR value may indicate more confidence in '0' being sent for the code bit, a negative LLR value may indicate more confidence in '1' being sent for the code bit, and an LLR value of zero may indicate equal likelihood of '0' or '1' being sent for the code bit. The receiver may then decode the LLRs to obtain decoded data, which is an estimate of the traffic data sent by the transmitter.

The computation for the LLRs may be complex. However, accurate LLRs may result in good decoding performance. There is therefore a need in the art for techniques to efficiently and accurately compute LLRs for code bits.

SUMMARY

Techniques for efficiently and accurately computing LLRs for code bits are described herein. A set of code bits may be mapped to a modulation symbol in a signal constellation for quadrature phase shift keying (QPSK), quadrature amplitude modulation (QAM), etc. Different code bits in the set may be associated with different LLR functions. The LLRs for the code bits may be derived based on piecewise linear approximation of the LLR functions.

In one design, a receiver obtains received symbols for a transmission sent via a communication channel. The transmission may comprise modulation symbols from a QPSK or QAM signal constellation. The receiver derives LLRs for code bits based on the received symbols and piecewise linear approximation of at least one LLR function. The received symbols may be complex values having real and imaginary components. The receiver may derive LLRs independently for the real and imaginary components of each received symbol, if permitted by the signal constellation for the modulation symbols.

The at least one LLR function may comprise a first LLR function for first code bits, e.g., sign bits that determine the sign of the real and imaginary components of the modulation symbols. The piecewise linear approximation of the first LLR function may comprise three linear functions for three ranges of input values. The receiver may select one of the three linear functions for each first code bit based on a corresponding received symbol component value. The receiver may then derive an LLR for each first code bit based on the linear function selected for that first code bit.

The at least one LLR function may comprise a second LLR function for second code bits, e.g., magnitude bits that determine the magnitude of the real and imaginary components of the modulation symbols. The piecewise linear approximation of the second LLR function may comprise two linear functions for two ranges of input values. The receiver may select one of the two linear functions for each second code bit based on a corresponding received symbol component value. The receiver may then derive an LLR for each second code bit based on the linear function selected for that second code bit.

The receiver may decode the LLRs for the code bits to obtain decoded data for the transmission sent via the communication channel. The receiver may perform Turbo decoding on the LLRs if Turbo encoding was used for the transmission and may perform Viterbi decoding on the LLRs if convolutional encoding was used for the transmission.

Various aspects and features of the disclosure are described in further detail below.

DETAILED DESCRIPTION

Figure 1:
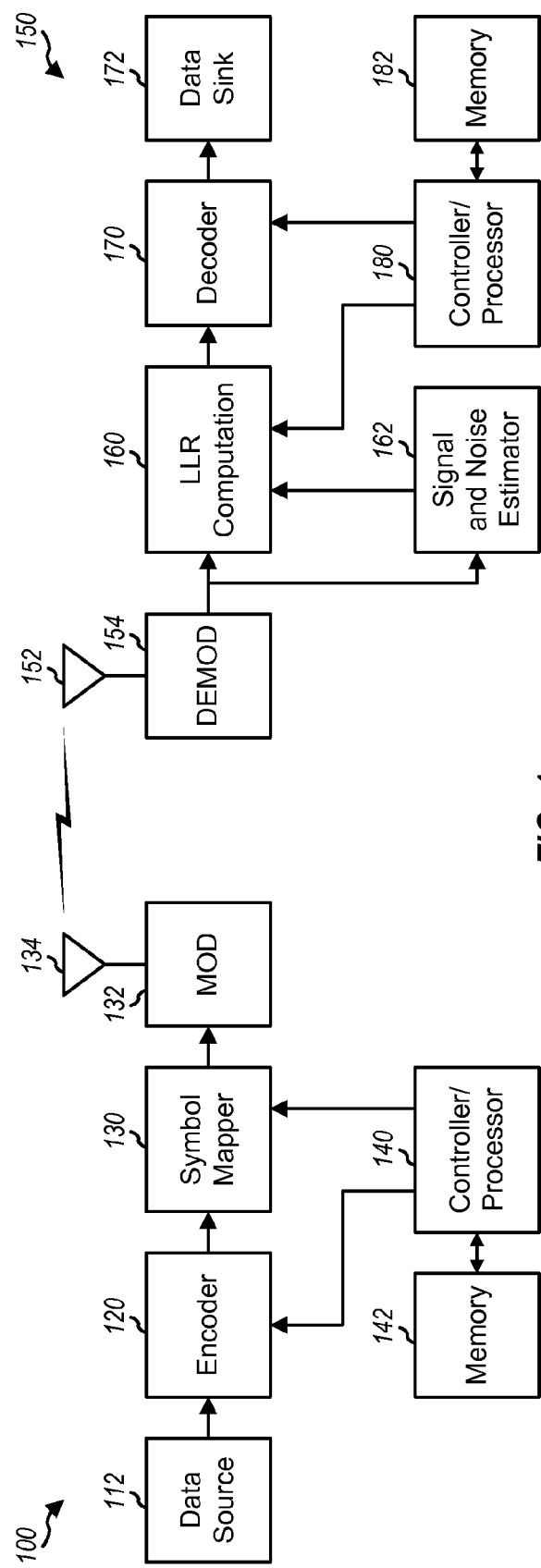
FIG. 1 shows a block diagram of a transmitter and a receiver.

FIG. 1 shows a block diagram of a design of a transmitter 100 and a receiver 150 in a communication system. At transmitter 100, an encoder 120 receives a block of data from a data source 112, encodes the data block based on a coding scheme, and provides code bits. A data block may also be referred to as a transport block, a packet, a frame, etc. Encoder 120 may perform rate matching and delete or repeat some or all of the code bits to obtain a desired number of code bits for the data block. Encoder 120 may also perform channel interleaving and reorder the code bits based on an interleaving scheme. A symbol mapper 130 maps the code bits to modulation symbols based on a modulation scheme, which may be QPSK, QAM, etc. A modulator (MOD) 132 may perform processing for coding division multiplexing (CDM) and spread the modulation symbols with orthogonal codes. Modulator 132 may also perform processing for frequency division multiplexing (FDM), orthogonal frequency division multiplexing (OFDM), single-carrier FDM (SC-FDM), etc. Modulator 132 then processes (e.g., converts to analog, amplifies, filters, and frequency upconverts) the resultant output symbols and generates a modulated signal, which is transmitted via an antenna 134.

At receiver 150, an antenna 152 receives the modulated signal from transmitter 100 and provides a received signal. A demodulator (DEMOD) 154 processes (e.g., filters, amplifies, frequency downconverts, and digitizes) the received signal to obtain samples. Demodulator 154 may further process the samples (e.g., for CDM, FDM, OFDM, SC-FDM, etc.) to obtain received symbols. A signal and noise estimator 162 may estimate signal and noise characteristics and/or the wireless channel response based on the received symbols. An LLR computation unit 160 computes LLRs for code bits based on the received symbols and the signal, noise and/or channel estimates. A decoder 170 decodes the LLRs in a manner complementary to the encoding performed by transmitter 100 and provides decoded data. In general, the processing by demodulator 154, LLR computation unit 160, and decoder 170 at receiver 150 is complementary to the processing by modulator 132, symbol mapper 130, and encoder 120 at transmitter 100.

Controllers/processors 140 and 180 direct the operation of various processing units at transmitter 100 and receiver 150, respectively. Memories 142 and 182 store data and program codes for transmitter 100 and receiver 150, respectively.

In general, encoder 120 may implement any coding scheme, which may include a Turbo code, a convolutional code, a low density parity check (LDPC) code, a cyclic redundancy check (CRC) code, a block code, etc., or a combination thereof. Encoder 120 may generate and append a CRC value to a data block, which may be used by receiver 150 to determine whether the data block was decoded correctly or in error. Turbo code, convolutional code, and LDPC code are different forward error correction (FEC) codes that allow receiver 150 to correct errors caused by impairments in the wireless channel.

Figure 2:
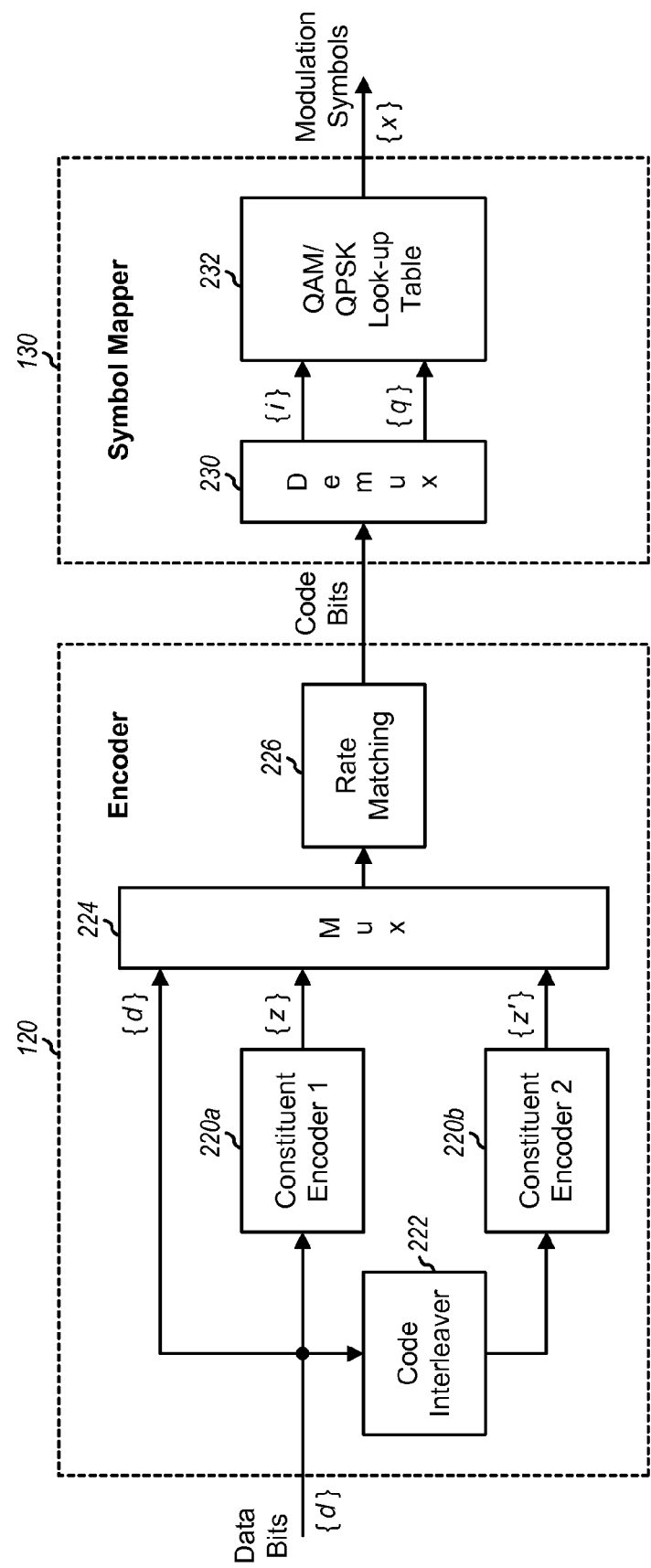
FIG. 2 shows an encoder and a symbol mapper at the transmitter.

FIG. 2 shows a block diagram of a design of encoder 120 and symbol mapper 130 at transmitter 100 in FIG. 1. In this design, encoder 120 implements a Turbo code, which is also referred to as a parallel concatenated convolutional code. Within encoder 120, a code interleaver 222 receives a block of data bits (denoted as $\{d\}$) and interleaves the data bits in accordance with a code interleaving scheme. A first constituent encoder 220a encodes the data bits based on a first constituent code and provides first parity bits (denoted as $\{z\}$). A second constituent encoder 220b encodes the interleaved data bits from code interleaver 222 based on a second constituent code and provides second parity bits (denoted as $\{z'\}$). Constituent encoders 220a and 220b may implement two generator polynomials, e.g., $g_0(D)=1+D^2+D^3$ and $g_1(D)=1+D+D^3$ used in Wideband Code Division Multiple Access (W-CDMA). A multiplexer (Mux) 224 receives the data bits and the parity bits from constituent encoders 220a and 220b, multiplexes the data and parity bits, and provides code bits. Multiplexer 224 may cycle through its three inputs and provide one bit at a time to its output, or $\{d_1, z_1, z'_1, d_2, z_2, z'_2, \ldots\}$. A rate matching unit 226 receives the code bits from multiplexer 224 and may delete some of the code bits and/or repeat some or all of the code bits to obtain a desired number of code bits for the data block. Although not shown in FIG. 2, encoder 120 may also perform channel interleaving on the code bits from rate matching unit 226.

Within symbol mapper 130, a demultiplexer (Demux) 230 receives the code bits from encoder 120 and demultiplexes the code bits into an inphase (I) stream $\{i\}$ and a quadrature (Q) stream $\{q\}$. Demultiplexer 230 may provide the first code bit to the I stream, then the next code bit to the Q stream, then the next code bit to the I stream, etc. A QAM/QPSK look-up table 232 receives the I and Q streams, forms sets of B bits, and maps each set of B bits to a modulation symbol based on a selected modulation scheme, where B=2 for QPSK, B=4 for 16-QAM, etc. Symbol mapper 130 provides modulation symbols $\{x\}$ for the data block.

Figure 3:
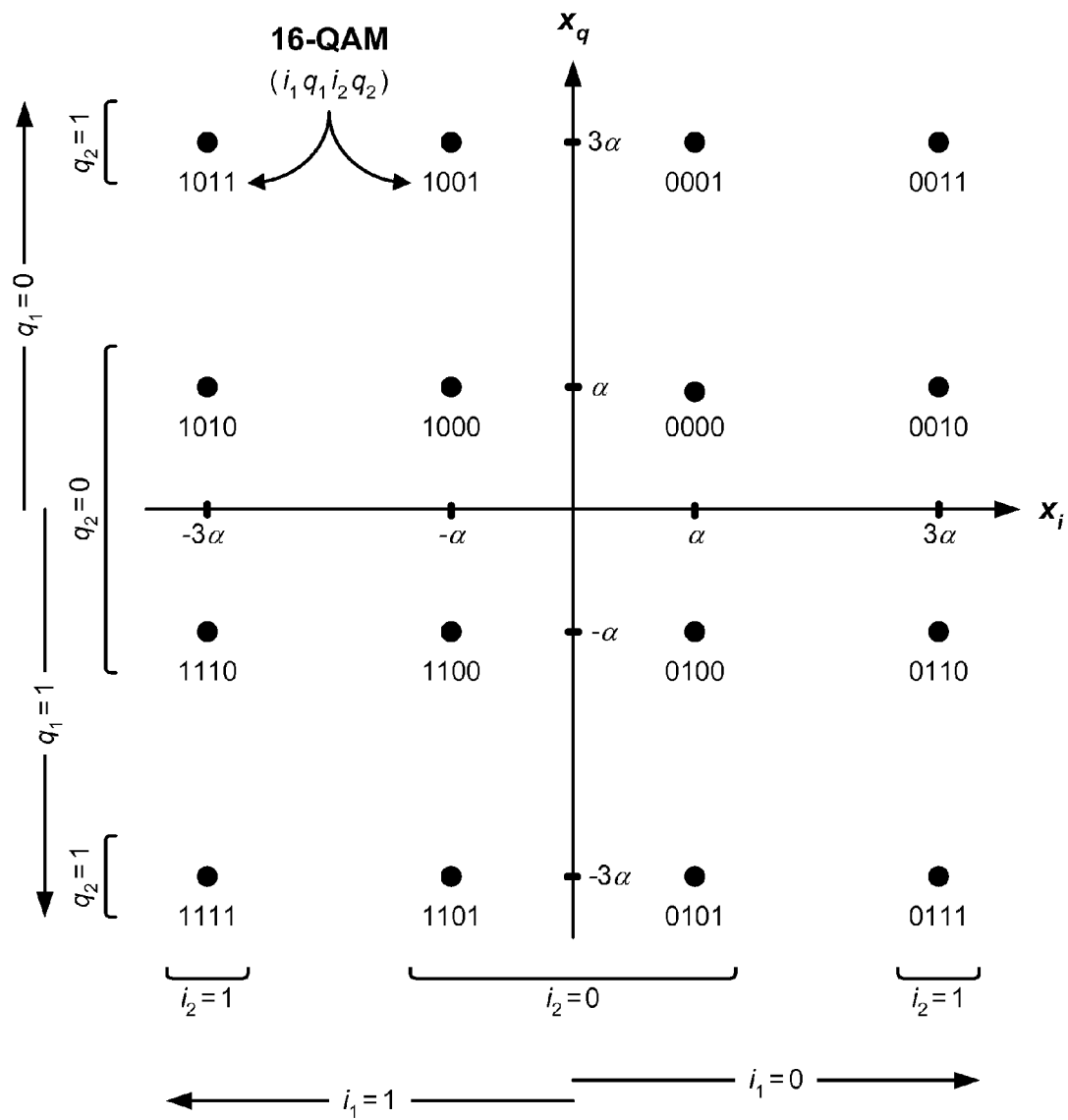
FIG. 3 shows an example signal constellation for 16-QAM.

FIG. 3 shows an example signal constellation for 16-QAM, which is used in W-CDMA. This signal constellation includes 16 signal points corresponding to 16 possible modulation symbols for 16-QAM. Each modulation symbol is a complex value of the form $x_i + j x_q$, where $x_i$ is the real component and $x_q$ is the imaginary component. The real component $x_i$ may have a value of $-3\alpha$, $-\alpha$, $\alpha$ or $3\alpha$, and the imaginary component $x_q$ may also have a value of $-3\alpha$, $-\alpha$, $\alpha$ or $3\alpha$, where $\alpha$ is defined below.

For 16-QAM, the code bits in the I and Q streams from demultiplexer 230 may be grouped into sets of four bits, with each set being denoted as $\{i_1\ q_1\ i_2\ q_2\}$, where bits $i_1$ and $i_2$ are from the I stream and bits $q_1$ and $q_2$ are from the Q stream. The 16 modulation symbols in the signal constellation are associated with 16 possible 4-bit values for $\{i_1\ q_1\ i_2\ q_2\}$. FIG. 3 shows an example mapping of each possible 4-bit value to a specific modulation symbol. In this mapping, the real component $x_i$ of a modulation symbol is determined by the two inphase bits $i_1$ and $i_2$, and the imaginary component $x_q$ is determined by the two quadrature bits $q_1$ and $q_2$. In particular, bit $i_1$ determines the sign of the real component $x_i$, with $x_i>0$ for $i_1=0$, and $x_i<0$ for $i_1=1$. Bit $i_2$ determines the magnitude of the real component $x_i$, with $|x_i|=\alpha$ for $i_2=0$, and $|x_i|=3\alpha$ for $i_2=1$. Bit $i_1$ may thus be considered as a sign bit for $x_i$, and bit $i_2$ may be considered as a magnitude bit for $x_i$. Similarly, bit $q_1$ determines the sign of the imaginary component $x_q$, and bit $q_2$ determines the magnitude of the imaginary component $x_q$. The mapping is independent for the real and imaginary components. For each component, 2-bit values of '11', '10', '00' and '01' are mapped to $-3\alpha$, $-\alpha$, $\alpha$, and $3\alpha$, respectively, based on pulse amplitude modulation (PAM). Two 4-PAM modulation symbols may thus be generated separately based on $(i_1\ i_2)$ and $(q_1\ q_2)$ and then quadrature combined to obtain a 16-QAM modulation symbol.

At receiver 150, the received symbols from demodulator 154 may be expressed as:

$$y=x+n, \qquad \text{Eq (1)}$$

where x is a modulation symbol sent by transmitter 100, n is the noise observed by modulation symbol x, and y is a received symbol obtained by receiver 150.

Received symbol y has (i) a real component $y_i$ corresponding to the real component $x_i$ of modulation symbol x and (ii) an imaginary component $y_q$ corresponding to the imaginary component $x_q$ of modulation symbol x. Equation (1) assumes that receiver 150 performs appropriate scaling to account for amplification of modulation symbol x, channel attenuation, and receiver processing. The modulation symbols sent by transmitter 100 may be assumed to be taken from the 16-QAM signal constellation with equal likelihood. For the 16-QAM signal constellation shown in FIG. 3, the average energy per received symbol component may be 5 $\alpha^2$. For a normalized 16-QAM signal constellation with unit energy per component, $\alpha=1/\sqrt{5}=0.4472$.

For simplicity, the noise n may be assumed to be complex additive white Gaussian noise (AWGN) with independent and identically distributed (i.i.d.) real and imaginary components. Each noise component may be a Gaussian random variable with zero mean and variance of $\sigma^2$. The variance of the complex noise n may thus be $N_0=2\sigma^2$. The signal-to-noise ratio (SNR) per component at receiver 150 is $5\alpha^2/\sigma^2$.

The real component $x_i$ and the imaginary component $x_q$ may be determined independently based on bits ($i_1$ $i_2$) and bits ($q_1$ $q_2$), respectively, as described above. The real and imaginary components of the noise n may be i.i.d. Hence, 16-QAM modulation symbol x may be considered as being composed of two independent 4-PAM modulation symbols $x_i$ and $x_q$ that may be demodulated separately. For clarity, the processing for only the real component $x_i$ determined by bits $i_1$ and $i_2$ is described below.

The LLRs for bits $i_1$ and $i_2$ may be derived as follows. From Bayes formula, the following expression may be obtained:

$$P(i_1 = 0 | y_i) = \frac{P(y_i | i_1 = 0) \cdot P(i_1 = 0)}{P(y_i)}, \quad \text{Eq (2)}$$

where $P(i_1=0|y_i)$ is an a posteriori probability that '0' was sent as bit $i_1$ given that $y_i$ was received, $P(y_i|i_1=0)$ is the probability of receiving $y_i$ given that '0' was sent as bit $i_1$, $P(i_1=0)$ is the a priori probability that '0' was sent as bit $i_1$, and $P(y_i)$ is the probability of receiving $y_i$.

Probability $P(i_1=0|y_i)$ may be conditioned on bit $i_2$ as follows:

$$P(i_1 = 0 | y_i) = \frac{P(y_i | i_1 i_2 = 00) \cdot P(i_2 = 0) + P(y_i | i_1 i_2 = 01) \cdot P(i_2 = 1)}{P(y_i)} \cdot P(i_1 = 0). \quad \text{Eq (3)}$$

An a posteriori probability $P(i_1=1|y_i)$ may be defined in similar manner as the a posteriori probability $P(i_1=0|y_i)$ in equations (2) and (3).

A likelihood ratio (LR) for bit $i_1$, $LR(i_1)$, may be defined as follows:

$$LR(i_1) = \frac{P(i_1 = 0 | y_i)}{P(i_1 = 1 | y_i)} = \frac{P(y_i | i_1 i_2 = 00) + P(y_i | i_1 i_2 = 01)}{P(y_i | i_1 i_2 = 10) + P(y_i | i_1 i_2 = 11)}. \quad \text{Eq (4)}$$

$LR(i_1)$ is the ratio of the a posteriori probability that '0' was sent as bit $i_1$ to the a posteriori probability that '1' was sent as bit $i_1$. Equation (4) assumes that all 16 points in the 16-QAM signal constellation are equally likely to be transmitted.

Using equation (4) and assuming that the noise distribution is AWGN, the likelihood ratio for bit $i_1$ may be expressed as:

$$LR(i_1) = \frac{e^{-\frac{(y_i-\alpha)^2}{2\sigma^2}} + e^{-\frac{(y_i-3\alpha)^2}{2\sigma^2}}}{e^{-\frac{(y_i+\alpha)^2}{2\sigma^2}} + e^{-\frac{(y_i+3\alpha)^2}{2\sigma^2}}}. \quad \text{Eq (5)}$$

The four exponential terms in equation (5) correspond to four Gaussian distributions at $-3\alpha$, $-\alpha$, $\alpha$ and $3\alpha$ on the real axis for four possible 2-bit values for bits $i_1$ and $i_2$.

An LLR for bit $i_1$, $LLR(i_1)$, may be obtained from equation (5), as follows:

$$LLR(i_1) = \frac{4\alpha y_i}{\sigma^2} + \ln\left(\frac{\cosh\left(\frac{\alpha y_i - 2\alpha^2}{\sigma^2}\right)}{\cosh\left(\frac{\alpha y_i + 2\alpha^2}{\sigma^2}\right)}\right). \quad \text{Eq (6)}$$

$LLR(i_1)$ is an increasing function of $y_i$ and is equal to zero for $y_i=0$.

$LLR(i_1)$ may be a positive value, zero, or a negative value. An $LLR(i_1)$ value of zero indicates equal confidence in '0' or '1' being sent for bit $i_1$. A positive $LLR(i_1)$ value indicates greater confidence in '0' being sent for bit $i_1$. A negative $LLR(i_1)$ value indicates greater confidence in '1' being sent for bit $i_1$. The sign of $LLR(i_1)$ thus represents whether there is more confidence in '0' or '1' being sent for bit $i_1$. The magnitude of $LLR(i_1)$ represents the degree of confidence, with a larger magnitude corresponding to greater confidence.

In general, an LLR function may have one or more decision thresholds. A decision threshold is an input value that results in a LLR value of 0. The LLR function in equation (6) has a single decision threshold of 0, which means that $LLR(i_1)=0$ when $y_i=0$.

An LR for bit $i_2$, $LR(i_2)$, may be defined as follows:

$$LR(i_2) = \frac{P(i_2 = 0 | y_i)}{P(i_2 = 1 | y_i)} = \quad \text{Eq (7)}$$

$$\frac{P(y_i | i_1 i_2 = 00) + P(y_i | i_1 i_2 = 10)}{P(y_i | i_1 i_2 = 01) + P(y_i | i_1 i_2 = 11)} = \frac{e^{-\frac{(y_i-\alpha)^2}{2\sigma^2}} + e^{-\frac{(y_i+\alpha)^2}{2\sigma^2}}}{e^{-\frac{(y_i-3\alpha)^2}{2\sigma^2}} + e^{-\frac{(y_i+3\alpha)^2}{2\sigma^2}}}.$$

An LLR for bit $i_2$, $LLR(i_2)$, may be obtained from equation (7) as follows:

$$LLR(i_2) = \frac{4\alpha^2}{\sigma^2} + \ln\left(\frac{\cosh\left(\frac{3\alpha y_i}{\sigma^2}\right)}{\cosh\left(\frac{3\alpha y_i}{\sigma^2}\right)}\right). \quad \text{Eq (8)}$$

The LLR function in equation (8) has two decision thresholds that are close to $2\alpha$ and $-2\alpha$ when the ratio $\alpha^2/\sigma^2$ is reasonably high. Thus, $LLR(i_2)=0$ when $y_i$ is close to $2\alpha$ or $-2\alpha$ for high $\alpha^2/\sigma^2$.

An LLR for bit $q_1$, $LLR(q_1)$, may be derived based on $y_q$ in an analogous manner as $LLR(i_1)$ using equation (6). Similarly, an LLR for bit $q_2$, $LLR(q_2)$, may be derived based on $y_q$ in an analogous manner as $LLR(i_2)$ using equation (8).

Equations (6) and (8) represent LLR functions for bits $i_1$ and $i_2$, respectively, for the 16-QAM signal constellation shown in FIG. 3 and with the assumptions described above. The LLR functions in equations (6) and (8) contain cosh functions and other arithmetic operations and may thus be computationally intensive.

In an aspect, the LLRs for code bits may be derived based on piecewise linear approximation of LLR functions. This may greatly reduce computation while still provide relatively accurate LLRs, so that degradation in decoding performance is negligible. The piecewise linear approximation may be obtained in several manners.

In equation (5), the four distributions have means that are spaced apart by $2\alpha$ and variances of $\sigma^2$. When ratio $\alpha^2/\sigma^2$ is reasonably high, i.e., for high received SNR, the bulk of each distribution is relatively narrow with respect to the spacing between the distribution means. In this case, for the numerator of equation (5), the term $$e^{\frac{-(y_i-\alpha)^2}{2\sigma^2}}$$

dominates when $y_i$ is close to $\alpha$, and the term $$e^{\frac{-(y_i-3\alpha)^2}{2\sigma^2}}$$

dominates when $y_i$ is close to $3\alpha$.

In a first design, which is referred to as Type 1, piecewise linear approximation of an LLR function is obtained by considering the maximum distribution in each of the numerator and denominator of the LLR function. For equation (5), the maximum of the two distributions in the numerator may be considered instead of their sum. Similarly, the maximum of the two distributions in the denominator may be considered instead of their sum. The LLR for bit $i_1$ may then be approximated as follows:

$$LLR(i_1) \approx \ln\frac{\underset{i_2=0,1}{\mathrm{Max}} P(y_i|i_1=0, i_2)}{\underset{i_2=0,1}{\mathrm{Max}} P(y_i|i_1=1, i_2)}, \quad \text{Eq (9)}$$

$$\text{where } \underset{i_2=0,1}{\mathrm{Max}} P(y_i|i_1=0, i_2) = \begin{cases} e^{\frac{-(y_i-\alpha)^2}{2\sigma^2}} & \text{if } y_i < 2\alpha \\ e^{\frac{-(y_i-3\alpha)^2}{2\sigma^2}} & \text{if } y_i \geq 2\alpha \end{cases}$$

$$\underset{i_2=0,1}{\mathrm{Max}} P(y_i|i_1=1, i_2) = \begin{cases} e^{\frac{-(y_i+3\alpha)^2}{2\sigma^2}} & \text{if } y_i < -2\alpha \\ e^{\frac{-(y_i+\alpha)^2}{2\sigma^2}} & \text{if } y_i \geq -2\alpha \end{cases}.$$

Piecewise linear approximation of the LLR function for bit $i_1$ may then be expressed as:

$$LLR(i_1) = \begin{cases} \frac{4\alpha y_i + 4\alpha^2}{\sigma^2} & \text{if } y_i < -2\alpha \\ \frac{2\alpha y_i}{\sigma^2} & \text{if } -2\alpha \leq y_i < 2\alpha \\ \frac{4\alpha y_i - 4\alpha^2}{\sigma^2} & \text{if } y_i \geq 2\alpha. \end{cases} \quad \text{Eq (10)}$$

As shown in equation (10), the LLR function for bit $i_1$ may be approximated with three straight lines. The first straight line is defined by a linear function $(4\alpha y_i+4\alpha^2)/\sigma^2$ and covers $y_i$ values less than $-2\alpha$. The second straight line is defined by a linear function $2\alpha y_i/\sigma^2$ and covers $y_i$ values from $-2\alpha$ to $2\alpha$. The third straight line is defined by a linear function $(4\alpha y_i-4\alpha^2)/\sigma^2$ and covers $y_i$ values of $2\alpha$ and larger.

The LLR for bit $i_2$ may be approximated as follows:

$$LLR(i_2) \approx \ln\frac{\underset{i_1=0,1}{\mathrm{Max}} P(y_i|i_2=0, i_1)}{\underset{i_1=0,1}{\mathrm{Max}} P(y_i|i_2=1, i_1)}, \quad \text{Eq (11)}$$

$$\text{where } \underset{i_1=0,1}{\mathrm{Max}} P(y_i|i_2=0, i_1) = \begin{cases} e^{\frac{-(y_i+\alpha)^2}{2\sigma^2}} & \text{if } y_i < 0 \\ e^{\frac{-(y_i-\alpha)^2}{2\sigma^2}} & \text{if } y_i \geq 0 \end{cases}$$

$$\underset{i_1=0,1}{\mathrm{Max}} P(y_i|i_2=1, i_1) = \begin{cases} e^{\frac{-(y_i+3\alpha)^2}{2\sigma^2}} & \text{if } y_i < 0 \\ e^{\frac{-(y_i-3\alpha)^2}{2\sigma^2}} & \text{if } y_i \geq 0 \end{cases}.$$

Piecewise linear approximation of the LLR function for bit $i_2$ may then be expressed as:

$$LLR(i_2) = \frac{-2\alpha|y_i| + 4\alpha^2}{\sigma^2}. \quad \text{Eq (12)}$$

As shown in equation (12), the LLR function for bit $i_2$ may be approximated with two straight lines. The first straight line is defined by a linear function $(2\alpha y_i+4\alpha^2)/\sigma^2$ and covers $y_i$ values less than zero. The second straight line is defined by a linear function $(-2\alpha y_i+4\alpha^2)/\sigma^2$ and covers $y_i$ values of zero and greater.

In a second design, which is referred to as Type 2, linear approximation of an LLR function may be defined around each decision threshold for the LLR function. The LLR function may have one or more decision thresholds. A linear function may be defined for each decision threshold and used to determine the LLR over a range of input values covering that decision threshold.

The LLR function for bit $i_1$ in equation (6) has a single decision threshold for $y_i=0$. The slope of this LLR function at the decision threshold may be determined by differentiating the LLR function with respect to $y_i$ at $y_i=0$, as follows:

$$S_1 = \frac{\partial LLR(i_1)}{\partial y_i}\bigg|_{y_i=0} = \frac{4\alpha}{\sigma^2} - \frac{2\alpha}{\sigma^2} \cdot \frac{1-e^{-\frac{4\alpha^2}{\sigma^2}}}{1+e^{-\frac{4\alpha^2}{\sigma^2}}}, \quad \text{Eq (13)}$$

where $S_1$ is the slope of the LLR function for bit $i_1$ at $y_i=0$.

For high $\alpha^2/\sigma^2$, the slope in equation (13) may be approximated as $2\alpha/\sigma^2$. Linear approximation of the LLR function for bit $i_1$ may then be expressed as:

$$LLR(i_1) = \frac{2\alpha y_i}{\sigma^2}. \quad \text{Eq (14)}$$

As shown in equation (14), the LLR function for bit $i_1$ may be approximated with a single straight line having a slope of $2\alpha/\sigma^2$ and a value of zero at the decision threshold of $y_i=0$.

The LLR function for bit $i_2$ in equation (8) has two decision thresholds for $y_i$ close to $-2\alpha$ and $2\alpha$. The slope of this LLR function at $2\alpha$ may be expressed as:

$$S_2 = \frac{\partial LLR(i_2)}{\partial y_i}\bigg|_{y_i=2\alpha} = \frac{\alpha}{\sigma^2} \cdot \frac{1-e^{-\frac{4\alpha^2}{\sigma^2}}}{1+e^{-\frac{4\alpha^2}{\sigma^2}}} - \frac{3\alpha}{\sigma^2} \cdot \frac{1-e^{-\frac{12\alpha^2}{\sigma^2}}}{1+e^{-\frac{12\alpha^2}{\sigma^2}}},$$  Eq (15)

where $S_2$ is the slope of the LLR function for bit $i_2$ at $y_i=2\alpha$.

For high $\alpha^2/\sigma^2$, the slope in equation (15) may be approximated as $-2\alpha/\sigma^2$ for the decision threshold of $2\alpha$. Linear approximation of the LLR function for bit $i_2$ may then be expressed as:

$$LLR(i_2) = \frac{-2\alpha|y_i| + 4\alpha^2}{\sigma^2}.$$  Eq (16)

As shown in equation (16), the LLR function for bit $i_2$ may be approximated with (i) a first straight line having a slope of $-2\alpha/\sigma^2$ and a value of zero at the decision threshold of $y_i=2\alpha$ and (ii) a second straight line having a slope of $2\alpha/\sigma^2$ and a value of zero at the decision threshold of $y_i=-2\alpha$.

As shown in equations (10) and (14), Type 1 approximation of the LLR function for bit $i_1$ matches Type 2 approximation of the LLR function for bit $i_1$ for $y_i$ values in the range of $-2\alpha$ to $2\alpha$. For $y_i$ values smaller than $-2\alpha$ or larger than $2\alpha$, the absolute value of the LLR for bit $i_1$ is smaller for Type 2 than Type 1. Hence, for a sufficiently large absolute $y_i$ value (e.g., more than $2\alpha$), the LLR from Type 2 may reflect less confidence in a decision for bit $i_1$ than the LLR from Type 1. Type 1 approximation of the LLR for bit $i_2$ in equation (12) matches Type 2 approximation of the LLR for bit $i_2$ in equation (16) for all $y_i$ values.

The LLR function for bit $i_1$ has a single decision threshold at 0. The LLR function for bit $i_2$ has two decision thresholds near $-2\alpha$ and $2\alpha$. A decision threshold represents a point at which there is maximum uncertainty on the likelihood of a given bit having been sent as '0' or '1'. Thus, it is desirable to have good approximation of LLRs around each decision threshold.

The LLR value for bit $i_2$ at a decision threshold may be expressed as:

$$LLR(i_2) = \frac{4\alpha^2}{\sigma^2} + \ln\left(\frac{\cosh\left(\frac{\alpha\theta}{\sigma^2}\right)}{\cosh\left(\frac{3\alpha\theta}{\sigma^2}\right)}\right) = 0,$$  Eq (17)

where $\theta$ is the decision threshold for the LLR function for bit $i_2$. $LLR(i_2)=0$ when $y_i=\theta$.

From equation (17), the decision threshold may be expressed as:

$$\theta = \frac{\sigma^2}{\alpha} \cdot \cosh^{-1}\left(\frac{\sqrt{3+e^{4\alpha^2/\sigma^2}}}{2}\right).$$  Eq (18)

Figure 4:
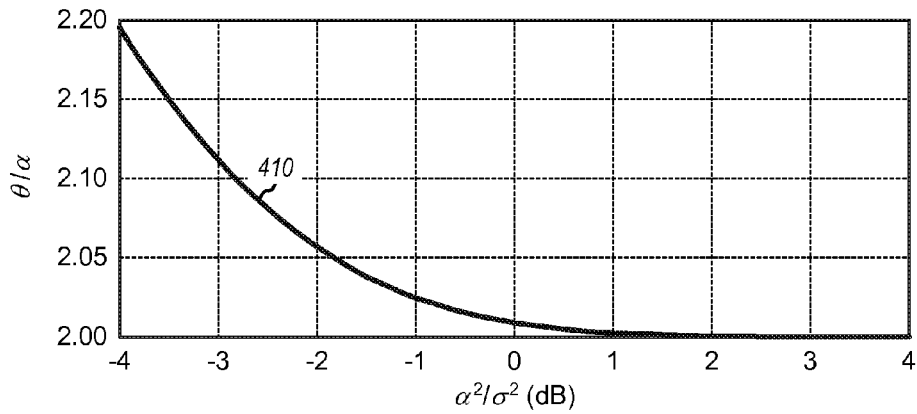
FIG. 4 shows a plot of a decision threshold for an LLR function.

FIG. 4 shows a plot 410 of a normalized decision threshold for the LLR function for bit $i_2$. The horizontal axis represents $\alpha^2/\sigma^2$ in units of decibel (dB). The vertical axis represents the normalized decision threshold, which is $\theta/\alpha$. Plot 410 indicates that the decision threshold $\theta$ is greater than $2\alpha$ at low SNR and converges to $2\alpha$ as SNR increases.

The slope of the LLR function for bit $i_2$ in equation (8) may be expressed as:

$$S_2' = \frac{\partial LLR(i_2)}{\partial y_i}\bigg|_{y_i=\theta} =$$  Eq (19)

$$\frac{\alpha}{\sigma^2} \cdot \sqrt{\frac{e^{\frac{4\alpha^2}{\sigma^2}}-1}{e^{\frac{4\alpha^2}{\sigma^2}}+3}} - \frac{3\alpha}{\sigma^2} \cdot \sqrt{\frac{e^{\frac{4\alpha^2}{\sigma^2}}+3-4e^{\frac{8\alpha^2}{\sigma^2}}}{e^{\frac{4\alpha^2}{\sigma^2}}+3}},$$

where $S_2'$ is the slope of the LLR function for bit $i_2$ at the decision threshold $\theta$. The slope $S_2'$ and/or the decision threshold $\theta$ may each be determined using hardware, software, look-up table, etc.

Linear approximation of the LLR for bit $i_2$ may then be expressed as:

$$LLR(i_2)=S_2'\cdot(|y_i|-\theta).$$  Eq (20)

For high SNR, $S_2' \approx -2\alpha/\sigma^2$ and $\theta \approx 2\alpha$.

Equations (18) to (20) may be used to derive a more accurate LLR for bit $i_2$ across a wide range of SNRs. Equation (18) provides the decision threshold $\theta$ as a function of $\alpha^2/\sigma^2$. Equation (19) provides the slope $S_2'$ as a function of $\alpha^2/\sigma^2$. The decision threshold $\theta$ and the slope $S_2'$ may be determined for a given received SNR and used in equation (20) to derive the LLR for bit $i_2$.

The slope of the LLR function for bit $i_1$, $S_1$, may also be expressed as a function of $\alpha^2/\sigma^2$, as shown in equation (13). The slope $S_1$ may be determined for a given received SNR and used in equation (10) or (14) to derive the LLR for bit $i_1$.

Figure 5A:
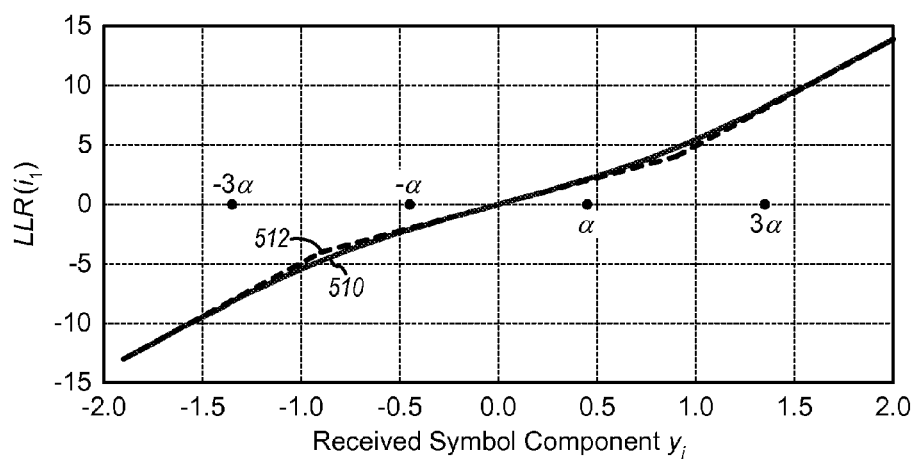
FIGS. 5A and 5B show piecewise linear approximation of two LLR functions for two code bits.

FIG. 5A shows plots of the actual LLR function for bit $i_1$ and piecewise linear approximation of this LLR function with $\alpha^2/\sigma^2=1$ or 0 dB. The horizontal axis represents $y_i$ value, with $\alpha=0.4472$. The four one-dimensional PAM constellation points at $-3\alpha$, $-\alpha$, $\alpha$ and $3\alpha$ are labeled on the horizontal axis. The vertical axis represents the LLR for bit $i_1$, or $LLR(i_1)$. A plot 510 shows the LLR for bit $i_1$ with the exact computation shown in equation (6). A plot 512 shows the LLR for bit $i_1$ with the piecewise linear approximation shown in equation (10). These plots indicate that the piecewise linear approximation is accurate with respect to the actual LLR values, especially around the decision threshold of $y_i=0$ where the LLR value is close to 0, which is important for good decoding performance.

Figure 5B:
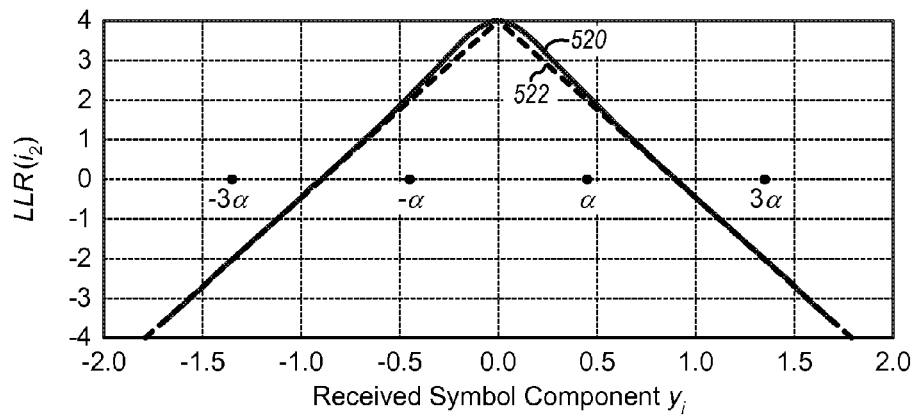

FIG. 5B shows plots of the actual LLR function for bit $i_2$ and piecewise linear approximation of this LLR function with $\alpha^2/\sigma^2=1$. A plot 520 shows the LLR for bit $i_2$ with the exact computation shown in equation (8). A plot 522 shows the LLR for bit $i_2$ with the piecewise linear approximation shown in equation (12). These plots indicate that the piecewise linear approximation is accurate with respect to the actual LLR values, especially around the decision thresholds near $-2\alpha$ and $2\alpha$ where the LLR value is close to 0.

FIGS. 5A and 5B show plots of the LLRs for bits $i_1$ and $i_2$ with $\alpha^2/\sigma^2=1$, which corresponds to a received SNR per component of approximately 7 dB. The approximations of the LLR functions for bits $i_1$ and $i_2$ are generally more accurate for progressively higher SNRs. 16-QAM may be used at higher SNRs whereas QPSK may be used at lower SNRs. These approximations may thus provide accurate LLRs for high SNR scenarios where 16-QAM is more likely to be used.

Figure 6:
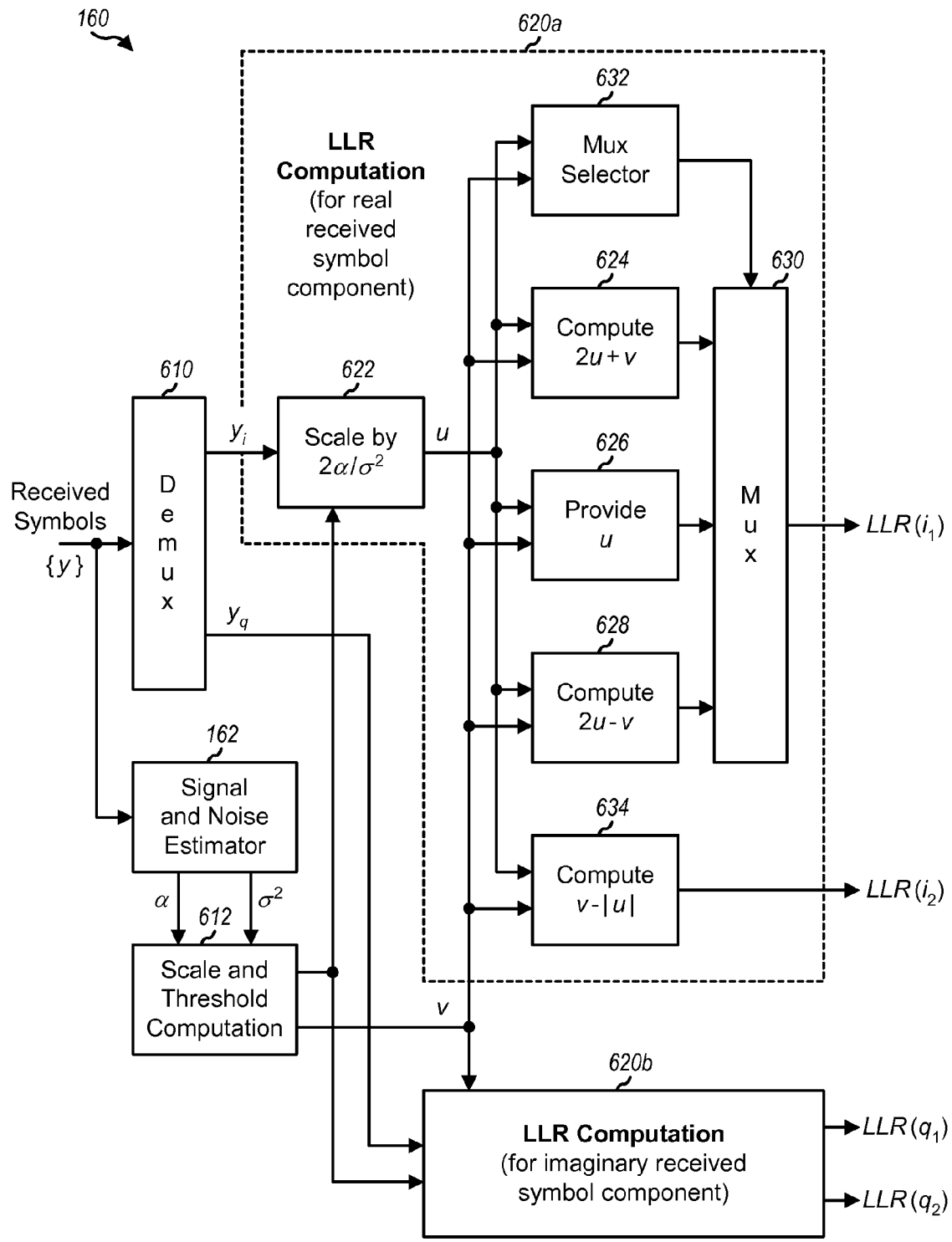
FIG. 6 shows an LLR computation unit at the receiver.

FIG. 6 shows a block diagram of a design of LLR computation unit 160 at receiver 150 in FIG. 1. In this design, unit 160 includes a demultiplexer 610, a scale and threshold computation unit 612, and LLR computation units 620a and 620b for the real and imaginary components, respectively. Demultiplexer 610 obtains received symbols {y} from demodulator 154, provides the real component $y_i$ of each received symbol to LLR computation unit 620a, and provides the imaginary component $y_q$ of each received symbol to LLR computation unit 620b. Each LLR computation unit 620 computes the LLRs for its code bits based on the piecewise linear approximations shown in equations (10) and (12). To simplify the LLR computation, two quantities u and v may be defined as follows:

$$u = \frac{2\alpha y_i}{\sigma^2} \quad \text{Eq (21)}$$

and $$v = \frac{4\alpha^2}{\sigma^2}. $$

Equation (10) may be expressed in terms of u and v as follows:

$$LLR(i_1) = \begin{cases} 2u+v & \text{if } u < -v \\ u & \text{if } -v \le u < v \\ 2u-v & \text{if } u \ge v \end{cases} \quad \text{Eq (22)}$$

Equation (12) may be expressed in terms of u and v as follows:

$$LLR(i_2) = v - |u|. \quad \text{Eq (23)}$$

Signal and noise estimator 162 may estimate signal and noise characteristics based on the received symbols as described below and provide the signal amplitude α and the noise variance $\sigma^2$. Computation unit 612 may compute a scale factor $2\alpha/\sigma^2$ and a scaled threshold $v=4\alpha^2/\sigma^2$ based on α and $\sigma^2$ from signal and noise estimator 162 and may provide the scale factor and the scaled threshold to both LLR computation units 620a and 620b. Within unit 620a, a scaling unit 622 scales the real component $y_i$ with the scale factor $2\alpha/\sigma^2$ and provides a scaled component $u=2\alpha \, y_i/\sigma^2$. A unit 624 computes the quantity 2u+v for the top part of equation (22). A unit 626 receives and provides u for the middle part of equation (22). A unit 628 computes the quantity 2u−v for the bottom part of equation (22). Units 624, 626 and 628 implement three linear functions for the piecewise linear approximation of the LLR function shown in equation (6). A multiplexer 630 receives three values from units 624, 626 and 628 at three inputs and provides one of the three values as the LLR for bit $i_1$. A Mux selector 632 receives u and v and generates a control for multiplexer 630. This control selects 2u+v from unit 624 if u<−v, selects u from unit 626 if −v≤u<v, and selects 2u−v from unit 628 if u≥v. A unit 634 computes v−|u| for equation (23) and provides this quantity as the LLR for bit $i_2$. Unit 634 may also compute the LLR for bit $i_2$ based on equations (18) to (20).

LLR computation unit 620b may compute the LLRs for bits $q_1$, and $q_2$ based on the imaginary component $y_q$. The computation of the LLRs for bits $q_1$ and $q_2$ may be analogous to the computation of the LLRs for bits $i_1$ and $i_2$ by unit 620a.

Signal and noise estimator 162 may estimate the mean of the absolute value of the received symbol components, as follows:

$$m = \frac{1}{2K} \cdot \sum_{k=1}^{K} \{|y_i(k)| + |y_q(k)|\}, \quad \text{Eq (24)}$$

where $y_i(k)$ and $y_q(k)$ are the real and imaginary components of the k-th received symbol, m is the mean of the absolute value of the received symbol components, and K is the number of received symbols used to estimate the mean.

Signal and noise estimator 162 may also estimate the average energy of the received symbol components, as follows:

$$E = \frac{1}{2K} \cdot \sum_{k=1}^{K} \{|y_i^2(k)| + |y_q^2(k)|\}, \quad \text{Eq (25)}$$

where E is the average energy of the received symbol components.

Signal and noise estimator 162 may map m and E to α and $\sigma^2$ based on one or more mappings, which may be determined based on analytical calculation, computer simulation, empirical measurement, etc. In one design, ratio $m^2/E$ is mapped to ratio α/m based on a first analytical function, and ratio $m^2/E$ is mapped to ratio $\sigma^2/m^2$ based on a second analytical function. The mappings may be performed with hardware, software, look-up tables, etc. α and $\sigma^2$ may then be determined from α/m and $\sigma^2/m^2$, respectively, since m is known.

Figure 7A:
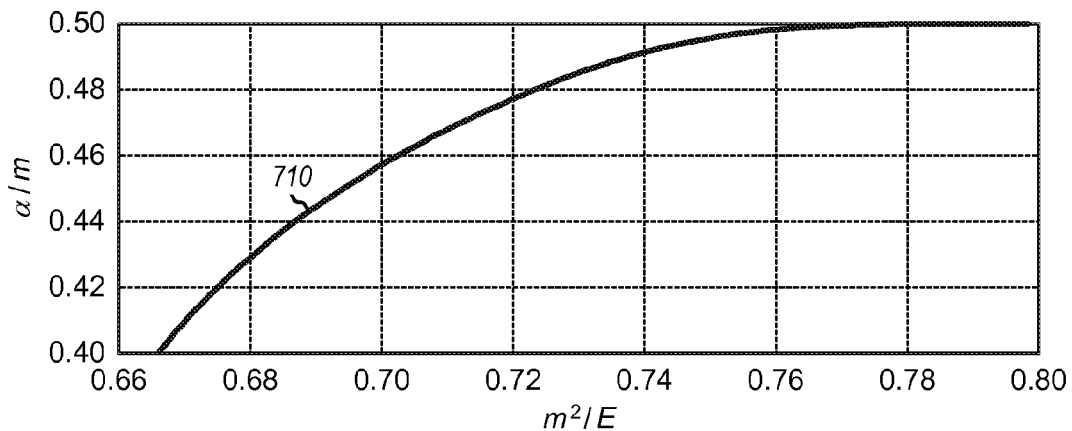
FIGS. 7A, 7B and 7C show plots of parameters used for approximation of LLR functions.

FIG. 7A shows a plot 710 of α/m versus $m^2/E$. Plot 710 shows α/m converging to 0.5 for high SNR since m approaches 2α.

Figure 7B:
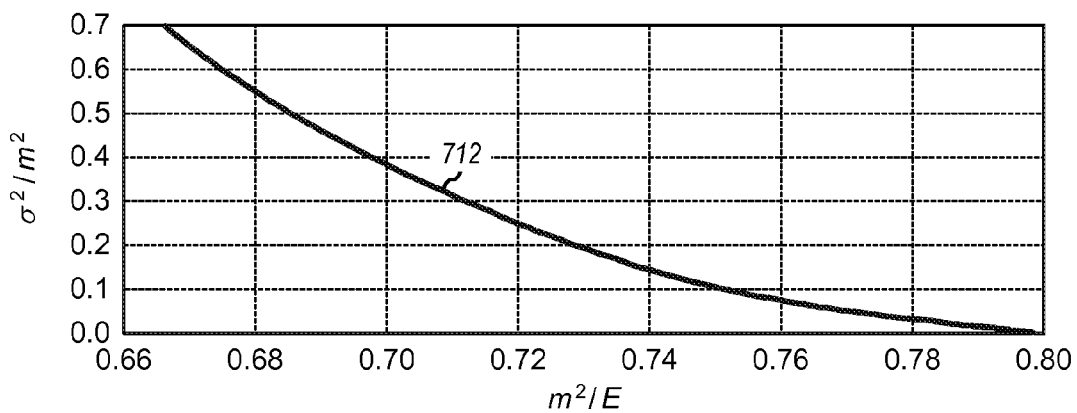

FIG. 7B shows a plot 712 of $\sigma^2/m^2$ versus $m^2/E$. Plot 712 shows $\sigma^2/m^2$ decreasing toward 0.0 for high SNR.

Figure 7C:
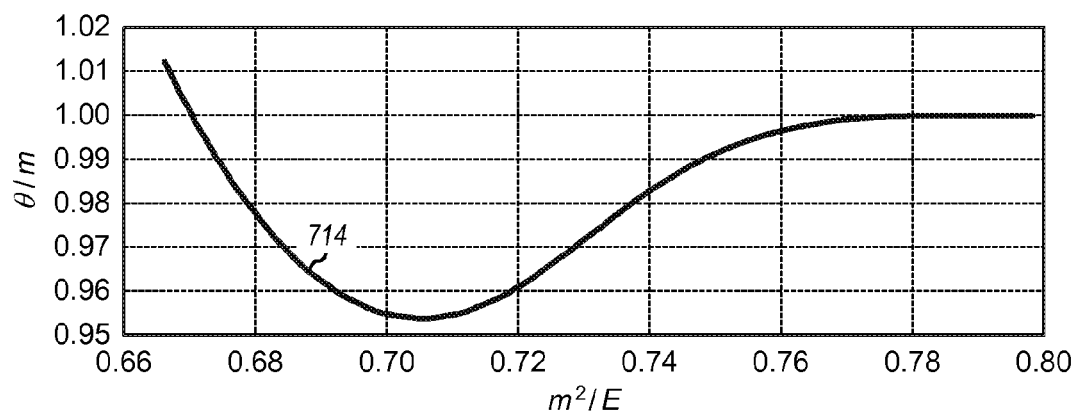

FIG. 7C shows a plot 714 of θ/m versus $m^2/E$. Plot 714 shows θ/m being close to 1.0 for a wide range of SNR. This suggests that fine representation of the scaled threshold v may be obtained even for low SNR by implementing the θ/m function with few bins in a look-up table, e.g., in signal and noise estimator 162.

Figure 8:
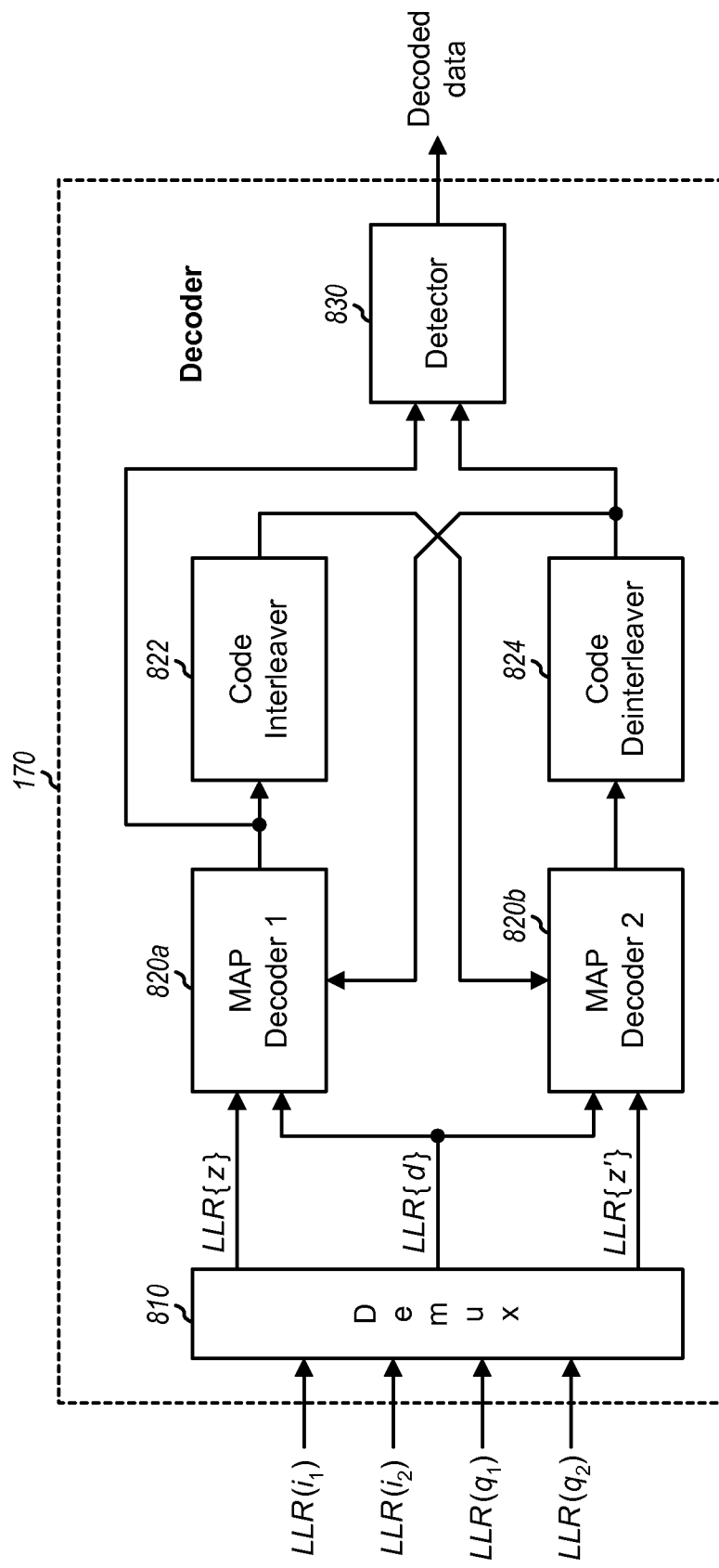
FIG. 8 shows a decoder at the receiver.

FIG. 8 shows a block diagram of a design of decoder 170 at receiver 150 in FIG. 1. In this design, decoder 170 implements a Turbo decoder that may be used for the Turbo encoder shown in FIG. 2. Within decoder 170, a demultiplexer 810 receives the LLRs for bits $i_1$, $i_2$, $q_1$ and $q_2$ from LLR computation unit 160, provides the LLRs for the data bits, LLR{d}, to maximum a posteriori (MAP) decoders 820a and 820b, provides the LLRs for the parity bits from first constituent encoder 220a, LLR{z}, to MAP decoder 820a, and provides the LLRs for the parity bits from second constituent encoder 220b, LLR{z'}, to MAP decoder 820b.

MAP decoder 820a receives the data bit LLRs, LLR{d}, and the first parity bit LLRs, LLR{z}, from demultiplexer 810 and deinterleaved data bit LLRs from a code deinterleaver 824. MAP decoder 820a derives new LLRs for the data and first parity bits based on the first constituent code used by encoder 220a. A code interleaver 822 interleaves the data bit LLRs from decoder 820a in accordance with the code interleaving scheme used at encoder 120 and provides interleaved data bit LLRs. MAP decoder 820b receives the data bit LLRs, LLR{z}, and the second parity bit LLRs, LLR{z'}, from demultiplexer 810 and the interleaved data bit LLRs from code interleaver 822. MAP decoder 820b then derives new LLRs for the data and second parity bits based on the second constituent code used by encoder 220b. Code deinterleaver 824 deinterleaves the data bit LLRs from decoder 820b and provides the deinterleaved data bit LLRs. MAP decoders 820a and 820b may implement a BCJR MAP algorithm or a lower complexity derivative, a soft-output Viterbi (SOV) algorithm, or some other decoding algorithm known in the art.

MAP decoders 820a and 820b may perform multiple decoding iterations. After all decoding iterations are completed, a detector 830 may combine the data bit LLRs from MAP decoder 820a and code deinterleaver 824 to obtain final data bit LLRs. Detector 830 may then slice the final data bit LLRs to obtain hard decisions for the data bits and provide decoded data.

The LLRs derived as described herein may also be used for other types of decoders such as Viterbi decoders commonly used with convolutional encoders.

Figure 9:
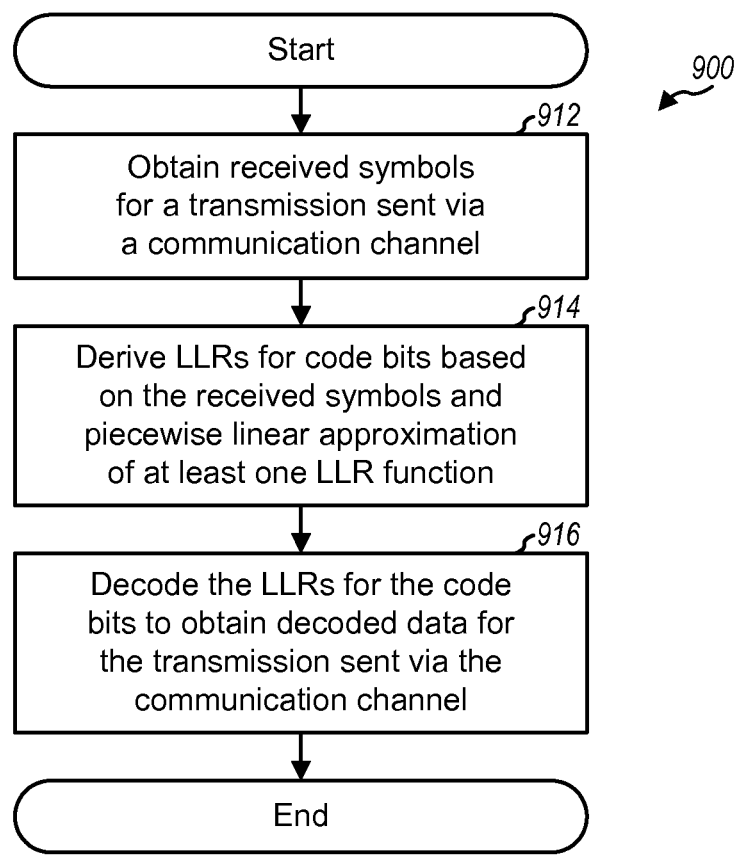
FIG. 9 shows a process for computing LLRs for code bits.

FIG. 9 shows a design of a process 900 for computing LLRs for code bits. Received symbols may be obtained for a transmission sent via a communication channel (block 912). The transmission may comprise modulation symbols from a QPSK or M-QAM signal constellation, where M may be 16 or higher. For example, the modulation symbols may be from the 16-QAM signal constellation shown in FIG. 3.

LLRs for code bits may be derived based on the received symbols and piecewise linear approximation of at least one LLR function (block 914). The received symbols may be complex values having real and imaginary components. The LLRs may be computed independently for the real and imaginary components of the received symbols, if permitted by the signal constellation for the modulation symbols, as described above.

The at least one LLR function may comprise a first LLR function for first code bits, e.g., sign bits that determine the sign of the real and imaginary components of the modulation symbols. The piecewise linear approximation of the first LLR function may comprise three linear functions for three ranges of input values, e.g., $y_i$ or $y_q$ values. These three linear functions may have odd symmetry about an input value of zero, e.g., $y_i=0$ as shown in FIG. 5A. One of the three linear functions may be selected for each first code bit based on a corresponding received symbol component value, e.g., $y_i$ or $y_q$ value. An LLR for each first code bit may then be derived based on the linear function selected for that first code bit, e.g., as shown in equation (22) and FIG. 6. The slope of one or more linear functions may be determined based on signal and noise estimates, which may correspond to $\alpha$ and $\sigma^2$.

The at least one LLR function may comprise a second LLR function for second code bits, e.g., magnitude bits that determine the magnitude of the real and imaginary components of the modulation symbols. The piecewise linear approximation of the second LLR function may comprise two linear functions for two ranges of input values. These two linear functions may have even symmetry about an input value of zero, e.g., $y_i=0$ as shown in FIG. 5B. One of the two linear functions may be selected for each second code bit based on a corresponding received symbol component value, e.g., $y_i$ or $y_q$ value. An LLR for each second code bit may be derived based on the linear function selected for that second code bit, e.g., as shown in equation (23). The slope and intercept point each linear function may be determined based on signal and noise estimates. The intercept point may be related to and determined by the decision threshold for the second LLR function.

Parameters for the piecewise linear approximation of the at least one LLR function may be derived based on the received symbols. The parameters may comprise the signal amplitude $\alpha$ and the noise variance $\sigma^2$, which may be estimated as described above. The parameters may also comprise a scale factor $2\alpha/\sigma^2$ for the received symbols and a scaled threshold $v=4\alpha^2/\sigma^2$. The parameters may also include other variables and/or quantities.

In general, the piecewise linear approximation of each LLR function may comprise one or more linear functions, e.g., at least two linear functions. The linear function(s) for each LLR function may be determined based on the mathematical expression for that LLR function.

The LLRs for the code bits may be decoded to obtain decoded data for the transmission sent via the communication channel (block 916). The decoding may be dependent on the encoding performed for the transmission. For example, Turbo decoding may be performed on the LLRs if Turbo encoding was used for the transmission, and Viterbi decoding may be performed on the LLRs if convolutional encoding was used for the transmission.

For clarity, the LLR computation techniques have been described for the 16-QAM signal constellation shown in FIG. 3. In general, the techniques may be used for various signal constellations such as QPSK, 4-PAM, 8-PSK, 16-QAM, 32-QAM, 64-QAM, 256-QAM, etc. The code bits of a modulation symbol may be associated with different LLR functions. For example, code bits $i_1$ and $q_1$ for a 16-QAM modulation symbol may be associated with a first LLR function, and code bits $i_2$ and $q_2$ for the 16-QAM modulation symbol may be associated with a second LLR function. Piecewise linear approximation may be used for each LLR function. Each LLR function may be approximated with one or more linear functions. The number of linear functions to use for the piecewise linear approximation of a given LLR function may be dependent on the mathematical expression for that LLR function, which may be different for different LLR functions. The LLRs for different code bits of a modulation symbol may be computed based on the piecewise linear approximations of the LLR functions for these code bits.

The techniques described herein may be used for various wireless communication systems and networks such as Code Division Multiple Access (CDMA) systems, Time Division Multiple Access (TDMA) systems, Frequency Division Multiple Access (FDMA) systems, Orthogonal FDMA (OFDMA) systems, Single-Carrier FDMA (SC-FDMA) systems, wireless local area networks (WLANs), etc. The terms "systems" and "networks" are often used interchangeably. A CDMA system may implement a radio technology such as Universal Terrestrial Radio Access (UTRA), Evolved UTRA (E-UTRA), cdma2000, etc. UTRA includes W-CDMA and Time Division-Synchronous CDMA (TD-SCDMA). cdma2000 covers IS-2000, IS-95 and IS-856 standards. A TDMA system may implement a radio technology such as Global System for Mobile Communications (GSM). An OFDMA system may implement a radio technology such as Long Term Evolution (LTE) (which is part of E-UTRA), IEEE 802.20, Flash-OFDM®, etc. A WLAN may implement a radio technology such as IEEE 802.11, Hiperlan, etc. These various radio technologies and standards are known in the art. The techniques may also be used for downlink and uplink transmissions and may be implemented at a base station and a terminal.

The techniques described herein may be implemented by various means. For example, these techniques may be implemented in hardware, firmware, software, or a combination thereof. For a hardware implementation, the processing units used to perform LLR computation may be implemented within one or more application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, electronic devices, other electronic units designed to perform the functions described herein, a computer, or a combination thereof.

For a firmware and/or software implementation, the techniques may be implemented with modules (e.g., procedures, functions, etc.) that perform the functions described herein. The firmware and/or software instructions may be stored in a memory (e.g., memory 182 in FIG. 1) and executed by a processor (e.g., processor 180). The memory may be implemented within the processor or external to the processor. The firmware and/or software instructions may also be stored in other processor-readable medium such as random access memory (RAM), read-only memory (ROM), non-volatile random access memory (NVRAM), programmable read-only memory (PROM), electrically erasable PROM (EEPROM), FLASH memory, compact disc (CD), magnetic or optical data storage device, etc.

An apparatus implementing the techniques described herein may be a stand-alone unit or may be part of a device. The device may be (i) a stand-alone integrated circuit (IC), (ii) a set of one or more ICs that may include memory ICs for storing data and/or instructions, (iii) an ASIC such as a mobile station modem (MSM), (iv) a module that may be embedded within other devices, (v) a cellular phone, wireless device, handset, or mobile unit, (vi) etc.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. An apparatus comprising:
  a processor configured to obtain real and imaginary components of received symbols for a transmission sent via a communication channel, and derive log-likelihood ratios (LLRs) for a first pair of code bits based on the real component of each of the received symbols and a second pair of code bits based on the imaginary component of each of the received symbols, the LLRs comprising:
    a first LLR function for sign bits that determine a sign of the real and imaginary components of the symbols; and
    a second LLR function for magnitude bits that determine a magnitude of the real and imaginary components of the symbols; and
  a memory coupled to the processor;
    wherein the LLRs comprise a piecewise linear approximation comprising a plurality of linear functions determined from an estimated signal amplitude of the received symbols, an estimated noise variance of the received symbols, a scale factor, and a scaled threshold.

2. The apparatus of claim 1, wherein the first pair of code bits and the second pair of code bits are each based on at least two LLR functions, wherein at least one of the two LLR functions comprises at least one piecewise linear approximation, and wherein the at least one piecewise linear approximation of each LLR function comprises at least two linear functions.

3. The apparatus of claim 1, wherein the first pair of code bits and the second pair of code bits are each based on at least two LLR functions, wherein at least one of the two LLR functions comprises at least one piecewise linear approximation; wherein at least two LLR functions comprise a first LLR function for first code bits, and wherein at least one piecewise linear approximation comprises an approximation of the first LLR function having three linear functions for three ranges of input values.

4. The apparatus of claim 3, wherein the first code bits determine sign of real and imaginary components of modulation symbols sent in the transmission.

5. The apparatus of claim 3, wherein the processor is configured to select one of the three linear functions for each first code bit based on a corresponding received symbol component value, and to derive an LLR for each first code bit based on the linear function selected for the first code bit.

6. The apparatus of claim 3, wherein the processor is configured to determine a slope of one of the three linear functions based on signal and noise estimates.

7. The apparatus of claim 3, wherein the three linear functions have odd symmetry about an input value of zero.

8. The apparatus of claim 3, wherein the at least two LLR functions comprise a second LLR function for second code bits, and wherein at least one piecewise linear approximation comprises an approximation of the second LLR function and comprises two linear functions for two ranges of input values.

9. The apparatus of claim 8, wherein the second code bits determine magnitude of real and imaginary components of modulation symbols sent in the transmission.

10. The apparatus of claim 8, wherein the processor is configured to select one of the two linear functions for each second code bit based on a corresponding received symbol component value, and to derive an LLR for each second code bit based on the linear function selected for the second code bit.

11. The apparatus of claim 8, wherein the processor is configured to determine a slope and an intercept point for each of the two linear functions based on signal and noise estimates.

12. The apparatus of claim 11, wherein the processor is configured to derive the signal and noise estimates based on the received symbols.

13. The apparatus of claim 8, wherein the two linear functions have even symmetry about an input value of zero.

14. The apparatus of claim 1, wherein the processor is configured to decode the LLRs for the code bits to obtain decoded data for the transmission sent via the communication channel.

15. The apparatus of claim 1, wherein the processor is configured to perform Turbo decoding on the LLRs for the code bits to obtain decoded data for the transmission sent via the communication channel.

16. The apparatus of claim 1, wherein the transmission comprises modulation symbols from an M-ary quadrature amplitude modulation (QAM) signal constellation, where M is 16 or higher.

17. The apparatus of claim 1, wherein the transmission comprises modulation symbols from a 16-QAM signal constellation.

18. The apparatus of claim 1, wherein the processor provides data to a decoder.

19. The apparatus of claim 1, wherein the scale factor comprises twice the estimated signal amplitude divided by the estimated noise variance.

20. The apparatus of claim 1, wherein the scaled threshold comprises four times the estimated signal amplitude squared divided by the estimated noise variance.

21. A method comprising:
obtaining real and imaginary components of received symbols identifying the received symbols in a constellation for a transmission sent via a communication channel; and
deriving log-likelihood ratios (LLRs) for a first pair of code bits based on the real component of each of the received symbols, and a second pair of code bits based on the imaginary component of each of the received symbols, the LLRs comprising:
a first LLR function for sign bits that determine a sign of the real and imaginary components of the symbols; and
a second LLR function for magnitude bits that determine a magnitude of the real and imaginary components of the symbols,
wherein the LLRs comprise a piecewise linear approximation comprising a plurality of linear functions determined from an estimated signal amplitude of the received symbols, an estimated noise variance of the received symbols, a scale factor, and a scaled threshold.

22. The method of claim 21, wherein the first pair of code bits and the second pair of code bits are each based on-at least two LLR functions, wherein at least one of the two LLR functions comprises at least one piecewise linear approximation;
wherein the at least two LLR functions comprise a first LLR function for first code bits, wherein at least one piecewise linear approximation comprises an approximation of the first LLR function having three linear functions for three ranges of input values, and wherein the deriving the LLRs for the code bits comprises
selecting one of the three linear functions for each first code bit based on a corresponding received symbol component value, and
deriving an LLR for each first code bit based on the linear function selected for the first code bit.

23. The method of claim 22, wherein the at least two LLR functions comprise a second LLR function for second code bits, wherein at least one piecewise linear approximation comprises an approximation of the second LLR function having two linear functions for two ranges of input values, and wherein the deriving the LLRs for the code bits comprises
selecting one of the two linear functions for each second code bit based on a corresponding received symbol component value, and
deriving an LLR for each second code bit based on the linear function selected for the second code bit.

24. The method of claim 21, further comprising:
decoding the LLRs for the code bits to obtain decoded data for the transmission sent via the communication channel.

25. An apparatus comprising:
means for obtaining real and imaginary components of received symbols identifying the received symbols in a constellation for a transmission sent via a communication channel; and
means for deriving log-likelihood ratios (LLRs) for a first pair of code bits based on the real component of each of the received symbols, and a second pair of code bits based on the imaginary component of each of the received symbols, the LLRs comprising:
a first LLR function for sign bits that determine a sign of the real and imaginary components of the symbols; and
a second LLR function for magnitude bits that determine a magnitude of the real and imaginary components of the symbols,
wherein the LLRs comprise a piecewise linear approximation comprising a plurality of linear functions determined from an estimated signal amplitude of the received symbols, an estimated noise variance of the received symbols, a scale factor, and a scaled threshold.

26. The apparatus of claim 25, wherein the first pair of code bits and the second pair of code bits are each based on-at least two LLR functions, wherein at least one of the two LLR functions comprises at least one piecewise linear approximation;
wherein the at least two LLR functions comprise a first LLR function for first code bits, wherein at least one piecewise linear approximation comprises an approximation of the first LLR function having three linear functions for three ranges of input values, and wherein the means for deriving the LLRs for the code bits comprises
means for selecting one of the three linear functions for each first code bit based on a corresponding received symbol component value, and
means for deriving an LLR for each first code bit based on the linear function selected for the first code bit.

27. The apparatus of claim 26, wherein the at least two LLR functions comprise a second LLR function for second code bits, wherein at least one piecewise linear approximation comprises an approximation of the second LLR function having two linear functions for two ranges of input values, and wherein the means for deriving the LLRs for the code bits comprises
means for selecting one of the two linear functions for each second code bit based on a corresponding received symbol component value, and
means for deriving an LLR for each second code bit based on the linear function selected for the second code bit.

28. The apparatus of claim 25, further comprising:
means for decoding the LLRs for the code bits to obtain decoded data for the transmission sent via the communication channel.

29. A processor-readable media for storing instructions to:
obtain real and imaginary components of received symbols identifying the received symbols in a constellation for a transmission sent via a communication channel; and
derive log-likelihood ratios (LLRs) for at least a first pair of code bits based on the real component of each of the received symbols, and at least a second pair of code bits based on the imaginary component of each of the received symbols, the LLRs comprising:
a first LLR function for sign bits that determine a sign of the real and imaginary components of the symbols; and
a second LLR function for magnitude bits that determine a magnitude of the real and imaginary components of the symbols,
wherein at least one LLR for one bit of the at least first pair of code bits and the second pair of code bits comprises a piecewise linear approximation comprising a plurality of linear functions determined from an estimated signal amplitude of the received symbols, an estimated noise variance of the received symbols, a scale factor, and a scaled threshold.

30. The processor-readable media of claim 29, wherein the first pair of code bits and the second pair of code bits are each based on-at least two LLR functions, wherein at least one of the two LLR functions comprises at least one piecewise linear approximation;
- wherein the at least two LLR functions comprise a first LLR function for first code bits, wherein at least one piecewise linear approximation comprises an approximation of the first LLR function having three linear functions for three ranges of input values, and wherein the processor-readable media further stores instructions to:
- select one of the three linear functions for each first code bit based on a corresponding received symbol component value, and
- derive an LLR for each first code bit based on the linear function selected for the first code bit.

31. The processor-readable media of claim 30, wherein the at least two LLR functions comprise a second LLR function for second code bits, wherein at least one piecewise linear approximation comprises an approximation of the second LLR function having two linear functions for two ranges of input values, and wherein the processor-readable media further stores instructions to:
- select one of the two linear functions for each second code bit based on a corresponding received symbol component value, and
- derive an LLR for each second code bit based on the linear function selected for the second code bit.

* * * * *